United States Patent [19]

Tuin

[11] 4,405,655
[45] Sep. 20, 1983

[54] METHOD AND ARRANGEMENT FOR INTERNALLY COATING A TUBE BY REACTIVE DEPOSITION FROM A GAS MIXTURE ACTIVATED BY A PLASMA

[75] Inventor: Hermanus N. Tuin, Eindhoven, Netherlands

[73] Assignee: U.S. Philips Corporation, New York, N.Y.

[21] Appl. No.: 371,093

[22] Filed: Apr. 23, 1982

[30] Foreign Application Priority Data

May 1, 1981 [NL] Netherlands ............... 8102149

[51] Int. Cl.³ .......................................... B05D 7/22
[52] U.S. Cl. ..................................... 427/38; 118/715; 427/39
[58] Field of Search ............... 118/715; 427/38, 39

[56] References Cited

U.S. PATENT DOCUMENTS

Re. 30,635  6/1981  Kuppers et al. ............... 427/38
4,145,456  3/1979  Kuppers et al. ............... 427/38

FOREIGN PATENT DOCUMENTS 1578826 11/1980 United Kingdom .

Primary Examiner—James R. Hoffman
Attorney, Agent, or Firm—Marc D. Schechter

[57] ABSTRACT

Tubes, consisting of an electrically insulating material such as $SiO_2$, are internally coated by reactive deposition form a gas mixture passing through the tube. The deposition is activated by a plasma reciprocally moving along within the tube. The plasma is formed in the tube by high-frequency electric energy capacitively applied to the gas phase by means of two flames which impinge upon the outside of the tube at two longitudinally spaced sites. The sites are reciprocally moved along the tube during the reactive deposition. A high-frequency generator is electrically connected to the burners generating the flames. An apparatus for coating tubes comprises a gas supply system, burners for generating a plasma and means for moving the burners.

6 Claims, 1 Drawing Figure

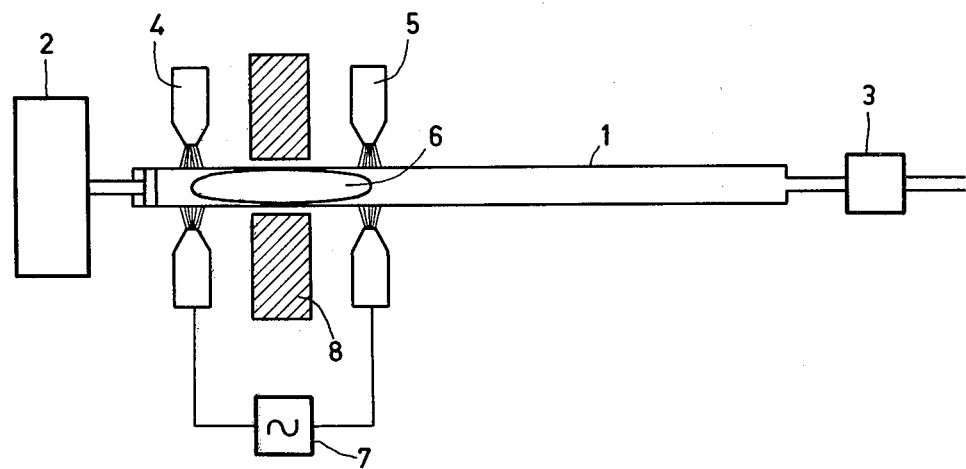

METHOD AND ARRANGEMENT FOR INTERNALLY COATING A TUBE BY REACTIVE DEPOSITION FROM A GAS MIXTURE ACTIVATED BY A PLASMA

BACKGROUND OF THE INVENTION

The invention relates to a method of internally coating a tube consisting of an electrically insulating material the coating is produced by reactive deposition from a gas mixture which is passed through the tube. The deposition is activated by a plasma which is reciprocally moved along the tube.

The invention also relates to an arrangement for internally coating a tube by means of a reactive deposition from a gas mixture which is passed through the tube. The arrangement comprises a gas supply system and means for producing a plasma in the gas phase in the tube and moving the plasma forward and backward through the tube.

Methods and arrangements of this type are known per se from, for example, U.S. Pat. No. 4,145,456 and United Kingdom Patent No. 1,578,826. According to the U.S. patent, high-frequency energy can be coupled into the tube by means of a cavity resonator. The coupling can be inductive or capacitive. The United Kingdom patent describes an inductive coupling via a coil. In both patents an additional heating of the tube is described. For that purpose an oven is employed in the U.S. patent. The United Kingdom patent describes the possibility of using the plasma to heat the tube. However, the use of an additional heat source to consolidate the deposited particles is not excluded and may be used in practice, as is described in later publications.

SUMMARY OF THE INVENTION

It is an object of the invention to provide a simplification of the prior art methods and arrangements for producing a reactive deposition from a gas mixture onto the inside surface of a tube by means of a plasma.

This object is accomplished by means of a method in which the plasma is formed in the tube by high-frequency electric energy capacitively applied to the gas phase by means of two flames which impinge upon the outside of the tube at two longitudinally spaced sites. These sites are reciprocally moved along the tube during the reactive deposition.

An apparatus for internally coating a tube according to the invention comprises a gas supply system for supplying the gas mixture to the tube, means for generating a plasma in the gas phase in a tube. Means for reciprocally moving the plasma along the tube are also included in the apparatus. The means for generating the plasma comprises two gas burners which heat the tube by direct contact with longitudinally spaced flames produced by the gas burners. The means for reciprocally moving the plasma along the tube constitute means for reciprocally moving the gas burners along the tube. Moreover, the gas burners are electrically connected to a high-frequency generator.

The method and apparatus according to the invention have the advantage that the tube is heated by the gas flames and simultaneously the high-frequency energy is capacitively coupled into the tube via the same flames which are electrically conductive due to the presence of ionized gases therein.

According to a preferred embodiment of the method and the apparatus, the gas burners are ring burners. The distance between the burners may be 30 to 80 cm. To prevent a plasma from being produced outside the tube, measures may be taken which adequately result in an interruption or change in the electric field outside the tube.

It is, for example, possible to position between the burners a cylinder consisting of a material having a dielectric constant larger than 2 and having a central bore through which the tube can be passed. This may be, for example, a cylinder of $SiO_2$ or $Al_2O_3$. The cylinder is reciprocated with the burners and may be 20 to 50 cm long. This measure is of particular importance if the pressure within the tube exceeds 100 Torr.

The inventive method and apparatus may be used in the manufacture of optical fibers. In a first step of the manufacturing process, some or a plurality of thin layers of doped or undoped silicon dioxide are deposited from a gas phase onto the inside surface of a glass tube. The tube may be, for example, a tube consisting of quartz glass. Depending on the nature of the generated plasma (isothermal or non-isothermal) a homogeneous or a heterogeneous reaction takes place during the deposition. In the first case a deposition of glass particles takes place in the gas. The deposited glass particles must be sintered to form a glass layer on the tube wall. In order to obtain a uniform deposition the tube must rotated during the deposition process. This process is used for pressures above 100 Torr. In the second case a glass layer is directly formed on the tube wall. Heating the tube to a temperature between approximately 1000° and 1400° C. is only necessary to prevent gas from being trapped and stresses from being produced in the layer during deposition. Usually, this process is used at pressures less than 100 Torr and a microwave plasma (frequency $\geq 1$ GHz) is used. Generally, the tube need not be rotated during deposition.

After a sufficient quantity of material has been deposited onto the inner surface of the tube, the tube is collapsed to form a solid preform by passing a burner along the rotating tube a few times, causing the glass tube to reach a temperature of about 2000° C. Surface tension leads to a gradual reduction of the diameter of the tube, to the point where the tubes fuses into a solid rod, the preform. Thereafter, this preform can be drawn into a fiber of the desired diameter (for example 125 $\mu$m). All known starting materials, such as $SiCl_4$, $GeCl_4$, $BCl_3$, $POCl_3$, $PCl_3$ and oxygen, of a purity required for fabricating optical fibers, are suitable for use with the invention.

BRIEF DESCRIPTION OF THE DRAWING

The sole drawing FIGURE schematically shows an embodiment of an apparatus according to the invention.

DESCRIPTION OF THE PREFERRED EMBODIMENTS

A gas mixture, for example consisting of $SiCl_4$, $GeCl_4$ and $O_2$ is passed through a tube 1 made of quartz glass, via a gas supply system 2. The reaction products are passed into the environment via a purifying system in which products which are harmful to the environment are removed, and/or via a pump 3. Depending on the type of process opted for, the reaction is performed at atmospheric pressure or at a pressure which is higher or lower than atmospheric pressure.

The tube 1 is heated by means of ring burners 4 and 5, which are located at a distance of 40 cm. High-frequency energy produced by a high-frequency generator 7 is capacitively coupled into the tube 1 to form a plasma 6. A cylinder 8, which consists of sintered silica and which is provided with a bore, is positioned between the burners 4 and 5. The burners 4 and 5 with the cylinder 8 are reciprocated along the tube 1 until a sufficient number of layers have been deposited.

What is claimed is:

1. A method of internally coating a tube consisting of an electrically insulating material, said method comprising the steps of:

passing a reactive gas mixture through the tube;
   forming flames contacting the outside of the tube at two longitudinally-spaced sites;
   reciprocally moving the flame sites along the tube; and
   forming a plasma in the tube by high-frequency electric energy capacitively coupled to the gas mixture by means of the two flames.

2. A method as claimed in claim 1, characterized in that:

the flames are formed by two longitudinally-spaced ring burners which are reciprocally moved along the tube; and
   the plasma is formed by electrically connecting a high frequency generator to the ring burners.

3. An apparatus for internally coating a tube consisting of an electrically insulating material, said apparatus comprising:

means for supplying a reactive gas mixture to the inside of the tube;
   two burners which, in operation, produce flames which contact the tube at longitudinally spaces sites;
   a high-frequency generator, electrically connected to the burners, for producing a plasma in the gas mixture in the tube; and
   means for reciprocally moving the burners along the tube.

4. An apparatus as claimed in claim 3, characterized in that burners are ring burners which burn a gaseous fuel.

5. An apparatus as claimed in claim 4, characterized in that:

the apparatus further comprises a cylinder, having a longitudinal bore in which the tube is disposed, said cylinder being disposed between the burners and having a dielectric constant greater than 2; and
   the means for reciprocally moving the burners also reciprocally moves the cylinder along the tube with the burners.

6. An apparatus as claimed in claim 3, characterized in that:

the apparatus further comprises a cylinder, having a longitudinal bore in which the tube is disposed, said cylinder being disposed between the burners and having a dielectric constant greater than 2; and
   the means for reciprocally moving the burners also reciprocally moves the cylinder along the tube with the burners.

* * * * *

UNITED STATES PATENT AND TRADEMARK OFFICE
CERTIFICATE OF CORRECTION

PATENT NO. : 4,405,655
DATED : September 20, 1983
INVENTOR(S) : HERMANUS N. TUIN It is certified that error appears in the above—identified patent and that said Letters Patent is hereby corrected as shown below:

In the claims:

Claim 3, Line 7, change "spaces" to --spaced--.

Signed and Sealed this

Third Day of January 1984

[SEAL]

Attest:

GERALD J. MOSSINGHOFF

Attesting Officer  Commissioner of Patents and Trademarks